(12) United States Patent
Shoulders et al.

(10) Patent No.: US 7,340,218 B2
(45) Date of Patent: Mar. 4, 2008

(54) PULSED SIGNAL DEVICE CHARACTERIZATION EMPLOYING ADAPTIVE NULLING AND IF GATING

(75) Inventors: Robert E. Shoulders, Santa Rosa, CA (US); Loren C. Betts, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 385 days.

(21) Appl. No.: 10/883,100

(22) Filed: Jun. 30, 2004

(65) Prior Publication Data

US 2006/0003723 A1  Jan. 5, 2006

(51) Int. Cl.
*H04B 17/00* (2006.01)
(52) U.S. Cl. .................... 455/67.11; 455/307
(58) Field of Classification Search ........... 455/67.11, 455/423, 424, 307, 339, 63.1, 67.13; 375/224, 375/239, 242, 254, 353; 333/17.1, 165, 166, 333/167
See application file for complete search history.

(56) References Cited

U.S. PATENT DOCUMENTS

| | | | | |
|---|---|---|---|---|
| 5,045,945 | A | * | 9/1991 | Herman et al. ............. 348/614 |
| 5,268,927 | A | * | 12/1993 | Dimos et al. ................ 375/147 |
| 5,278,780 | A | * | 1/1994 | Eguchi ........................ 708/322 |
| 5,744,969 | A | * | 4/1998 | Grochowski et al. ........ 324/614 |
| 5,872,540 | A | * | 2/1999 | Casabona et al. ........... 342/362 |
| 5,937,006 | A | * | 8/1999 | Clark et al. .................. 375/224 |
| 5,940,455 | A | * | 8/1999 | Ikeda .......................... 375/350 |

OTHER PUBLICATIONS

Robert E. Shoulders et al., "Pulsed Antenna Measurements with the Agilenet PNA Microwave Network Analyzer", Proceedings of the Meeting and Symposium of Antenna Measurement and Techniques Association, Irvine, CA, USA, 2003, pp. 86-91.
Loren Betts et al., "Improved Techniques for High-Performance Pulsed Measurements using Microwave Vector Network Analyzers", Proceedings of Asia Pacific Microwave Conference (APMC) 2003.
Loren Betts, "Make Accurate Pulsed S-Parameter Measurements", Microwaves and RF, Nov. 2003, Vol. 42, No. 11.
David Vondran, "Techniques for Pulsed S-Parameter Measurements", High Frequency Electronics, Mar. 2003, pp. 50-57.
5989-0563EN "PNA Microwave Network Analyzers, Accurate Pulsed Measurements", Application Note 1408-11, Agilent Technologies, Inc., Feb. 17, 2004, pp. 1-16.

(Continued)

*Primary Examiner*—Quochien B. Vuong

(57) ABSTRACT

A receiver channel, test system and method employ adaptive nulling to filter a targeted frequency component from a pulsed signal to produce a filtered pulsed signal. The filtered pulsed signal facilitates measuring pulsed performance parameters of a device under test. The receiver channel includes an adaptive nulling filter having a frequency response with a null that is adjustable in a null location to correspond to a vicinity of the targeted component. The test system includes a pulsed signal source, a test set, and a controller that controls the signal source and the test set. The test set includes the receiver channel with the adaptive nulling filter. The method of adaptive null filtering includes adjusting a location of a null in a frequency response of the adaptive nulling filter to correspond to a vicinity of the targeted component to produce the filtered pulsed signal.

30 Claims, 6 Drawing Sheets

OTHER PUBLICATIONS 5989-0221EN, "Pulsed Antenna Measurements Using PNA Network Analyzers", White Paper, Agilent Technologies, Inc., Jan. 6, 2004, pp. 1-12.

5988-7989EN, "Agilent PNA Series Microwave Network Analyzers, Configuration Guide", Agilent Technologies, Inc., Feb. 1, 2004, pp. 1-20.

* cited by examiner

PULSED SIGNAL DEVICE CHARACTERIZATION EMPLOYING ADAPTIVE NULLING AND IF GATING

BACKGROUND

Vector network analyzers (VNAs) measure performance characteristics of a device under test (DUT) in terms of S-parameters. In particular, the VNA applies a radio frequency (RF) stimulus signal to one or more ports of the DUT and measures one or more of a reflected response and a transmitted response at each of the DUT ports. The VNA then employs a comparison of the applied RF stimulus signal to the measured responses to calculate the S-parameters for the DUT. The S-parameters, typically determined as a function of frequency, characterize a performance of the DUT.

Traditionally, VNAs often employed a continuous wave (CW) signal as the applied RF signal. As such, the VNA essentially measured a CW response of the DUT and produced S-parameters from the measured CW response. While CW stimulus signals and/or CW measurements may be acceptable in many cases, for some situations a pulse modulated (i.e., 'pulsed') applied RF stimulus signal and/or a pulsed measurement of the DUT response may be preferred or even required. For example, pulsed signals and/or pulsed measurements may be preferred when testing high-power microwave amplifiers to prevent damage to the DUT due to overheating. Similarly, when evaluating a performance of an active array antenna designed to operate with pulsed signals, pulsed RF stimulus signals may be the only practical alternative. Therefore, modern VNAs often provide for measuring S-parameters of such 'pulsed' DUT by using pulsed RF stimulus signals and/or by employing pulse-oriented response measurements (pulsed measurements) of the DUT.

In general, approaches to measuring so-called 'pulsed DUTs' with a VNA can be broken down into two main categories: broadband and narrowband. VNAs in the broadband category utilize broadband receivers having rapid rise times and either fast synchronous detectors or high-speed analog-to-digital converters (ADCs). The so-called broadband VNAs utilize the broadband receivers to sample, capture and process with minimal distortion narrow pulses received from the DUT and/or an RF stimulus source. VNAs in the narrowband category typically employ narrowband receivers synchronized to a pulse repetition frequency (PRF) of the pulsed DUT. In particular, the narrowband receivers are synchronized to the PRF by filtering the received pulsed signal to preserve a fundamental frequency and to remove harmonic frequencies associated with the pulsed signal.

Unfortunately, broadband VNAs are typically limited in terms of a minimum pulse width by an ultimate bandwidth performance (e.g., receiver rise-time, detector/ADC speed, etc.) that is achievable given the performance, availability and cost of broadband receiver components. On the other hand, while typically having less stringent requirements for receiver component performance than broadband VNAs, narrowband VNAs are limited to a minimum PRF by a stopband performance limit of a bandpass filter used in processing the received signal pulses.

Accordingly, it would be advantageous have a VNA for measuring pulsed DUTs that employed narrowband receivers and did not suffer from the stopband performance limit of the bandpass filter. Such a pulsed measurement VNA would solve a long-standing need in the area of pulsed RF measurement of DUTs.

BRIEF SUMMARY

In some embodiments of the present invention, an adaptive nulling receiver channel is provided. The adaptive nulling receiver channel comprises an adaptive nulling filter that has a frequency response with one or more nulls that are adjustable, such that a null location is adjusted to correspond to a vicinity of a targeted frequency component in a pulsed signal. The filter adaptively filters the targeted frequency component from the pulsed signal to produce a filtered pulsed signal. The receiver channel is a component of a test system uses the filtered pulsed signal to produce measured performance parameters of a device under test (DUT).

In other embodiments of the present invention, a test system providing adaptive nulling is provided. The test system comprises a pulsed signal source; a test set; and a controller that controls an operation of the pulsed signal source and the test set. The test set comprises a plurality of receiver channels. A receiver channel of the plurality comprises an adaptive nulling filter that has adjustable nulls in a frequency response of the filter. A null location is adjusted to a vicinity of a targeted frequency component in a pulsed signal to filter adaptively the targeted frequency component from a fundamental frequency component of the pulsed signal. The test system measures performance parameters of a device under test (DUT) in a pulsed signal environment.

In other embodiments of the present invention, a method of adaptive null filtering is provided. The method comprises adaptively nulling targeted frequency components in a pulsed signal received from a device under test (DUT) to produce a filtered pulsed signal. Adaptively nulling comprises adjusting a location of a null in a frequency response of an adaptive nulling filter to correspond to a vicinity of a targeted frequency component. The filtered pulsed signal facilitates measuring a performance of the DUT in a pulsed environment.

Certain embodiments of the present invention have other features in addition to and in lieu of the features described hereinabove. These and other features of the invention are detailed below with reference to the following drawings.

BRIEF DESCRIPTION OF THE DRAWINGS

The various features and embodiments of the present invention may be more readily understood with reference to the following detailed description taken in conjunction with the accompanying drawings, where like reference numerals designate like structural elements, and in which.

DETAILED DESCRIPTION

Various embodiments of present invention facilitate measuring performance parameters for a device under test (DUT) in a pulsed signal environment. In some embodiments, adaptive nulling is employed to reduce effects of harmonics of a pulse modulated (i.e., 'pulsed') signal received from the DUT that is operated or tested in the pulsed environment. In some embodiments, the adaptive nulling is employed to substantially eliminate or remove such effects. In particular, filter transmission nulls are adapted to frequencies of targeted signal components including, but not limited to, unwanted or undesired frequency harmonics, thereby reducing an effect of the components. The received pulsed signal provides data from which the measured parameters of the DUT may be determined. The received pulsed signal is essentially free of the effects of the targeted components or harmonics as a result of the adaptive nulling. In some embodiments, intermediate frequency (IF) gating is used in addition to adaptive nulling in measuring the DUT performance parameters in the pulsed environment.

As used herein, 'pulsed' environment refers to a test or measurement environment in which the DUT produces at an output port a pulsed signal being measured. For example, in some embodiments, the pulsed environment comprises a pulse modulated radio frequency (RF) stimulus signal applied to an input of the DUT, the signal passing through the DUT and exiting at the output port. In other embodiments, the pulsed environment comprises pulse modulating a power supply or an operational state of the DUT to cause a signal passing therethrough to be pulse modulated. In yet other embodiments, the pulsed environment comprises a DUT that produces a pulse modulated output signal. In yet other embodiments, the pulsed environment is a combination of one or more of the previously described pulsed environments.

Performance parameters measured for the DUT in the pulse environment include, but are not limited to, S-parameters of the DUT. Test equipment and test systems used to measure the DUT performance parameters include, but are not limited to, a power meter, a spectrum analyzer, scalar network analyzer, and a vector network analyzer (VNA). For example, a VNA may be employed to measure S-parameters for the DUT in the pulsed environment using one or both of adaptive nulling and IF gating according to an embodiment of the present invention. Hereinafter, where necessary for understanding or discussion purposes, a VNA measuring S-parameters of the DUT in the pulsed environment is assumed without limiting the scope of the present invention unless otherwise noted.

Figure 1:
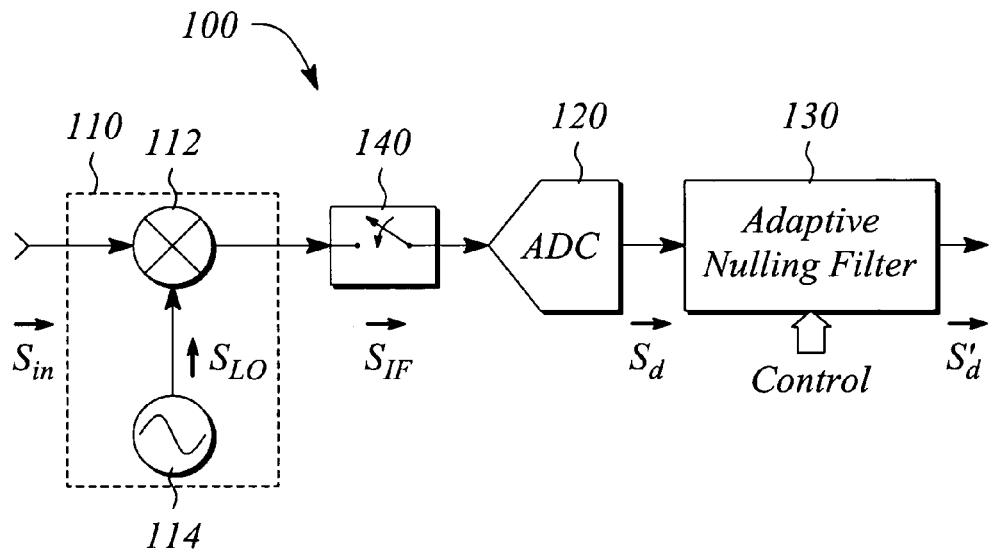
FIG. 1 illustrates a block diagram of an adaptive nulling receiver channel for measuring a device under test (DUT) performance in a pulsed environment according to an embodiment of the present invention.

FIG. 1 illustrates a block diagram of an adaptive nulling receiver channel 100 for measuring DUT performance in a pulsed environment according to an embodiment of the present invention. In some embodiments, the adaptive nulling receiver channel 100 is a receiver channel of a VNA used to measure S-parameters of the DUT. In such embodiments, the adaptive nulling receiver channel 100 generally receives the pulsed input signal $S_{in}$ either from the DUT (e.g., when the receiver channel is a measurement channel) or from a signal source (e.g., when the receiver channel is a reference channel). For discussion purposes hereinbelow, a distinction between the measurement and reference channels is largely immaterial with respect to the present invention when considering a VNA. As such, the distinction will be suppressed except where necessary to understand the invention or an aspect thereof.

The pulsed input signal $S_{in}$ generally is referred to herein as an 'RF signal' having an RF frequency while another signal described hereinbelow is referred to as an 'IF signal' having an IF frequency. The use of RF and IF, while having a specific meaning at times, is generally employed herein merely for the purposes of distinguishing the input signal $S_{in}$ and its frequency from that of the IF signal and its frequency. For example, in some embodiments, the RF signal may have an RF frequency in the range from 500 MHz to 40 GHz or more, while the IF signal may have a frequency in the range of a few tens of MHz. In other embodiments, the IF frequency may be higher than or within the RF frequency range.

Referring to FIG. 1, the adaptive nulling receiver channel 100 comprises a frequency converter 110. The frequency converter 110 receives and converts the pulsed input signal $S_{in}$ to an IF signal $S_{IF}$. When the IF frequency of the IF signal is lower than the RF frequency of the pulsed input signal $S_{in}$, the converter 110 is referred to as a 'downconverter'. When the IF frequency of the IF signal $S_{IF}$ is higher than that of the pulsed input signal $S_{in}$, the converter 110 is referred to as an 'upconverter'.

In some embodiments, the converter 110 comprises a mixer 112 and a local oscillator (LO) 114. The mixer 112 is a device that essentially multiplies the input signal $S_{in}$ by an LO signal $S_{LO}$ generated by the LO 114. A product of the LO signal and the input signal $S_{in}$ is the IF signal $S_{IF}$. The mixer 112 may be any mixer such as, but not limited to, a harmonic mixer. In some embodiments, the LO 114 generates the LO signal $S_{LO}$ having a variable or 'tunable' frequency. In such embodiments, the converter 110 is a tunable converter 110. In some cases, such a tunable converter 110 is referred to as a heterodyne converter. In some embodiments, the LO signal $S_{LO}$ may be provided from outside the receiver in which case the LO 114 is omitted. For example, the LO signal $S_{LO}$ may be provide by a common LO shared by several receiver channels 100.

The adaptive nulling receiver 100 further comprises an analog to digital converter (ADC) 120. The ADC 120 may be any device that converts an analog signal into a digital signal. In some embodiments, the ADC 120 digitizes the analog signal such that a waveform of the analog signal is essentially preserved. The ADC 120 samples and digitizes the IF signal $S_{IF}$ to produce a digital signal $S_d$. The digital signal $S_d$ is characterized by a sample rate/frequency or a sample period (e.g., a reciprocal of the sample frequency) of the ADC 120. In general, the digital signal $S_d$ is further characterized by a sample resolution (e.g., a number of bits per sample in a binary system). Hereinbelow, all components following the ADC 120 are assumed to be compatible with the sampling rate and sample resolution of the ADC 120 unless otherwise noted.

The adaptive nulling receiver channel 100 further comprises an adaptive nulling digital filter 130. The adaptive nulling digital filter 130 receives and filters the digital signal $S_d$ to produce a filtered digital signal $S'_d$. The adaptive nulling digital filter 130 comprises a control input (e.g., 'control' in FIG. 1) that receives a control command. The control command adjusts a performance of the digital filter 130. In particular, the control input adjusts a position of one or more nulls in a filter frequency response (e.g., transmission characteristic) of the adaptive nulling digital filter 130. As used herein, a 'null' generally refers to points within the filter frequency response having relatively high attenuation when compared with a pass or transmission band portion of the frequency response. In particular, the null may correspond with a location of a zero in the frequency response of the filter. A 'zero' is a frequency at which a transfer function or a z-transform of the transfer function describing the filter equals approximately zero.

In some embodiments, the nulls are adjusted to correspond to frequency locations of targeted signal components in the digital signal $S_d$. For example, the targeted signal components may be unwanted or undesirable signal components or signal harmonics. The frequency correspondence between the nulls and the signal harmonics may be approximate in some embodiments. Therefore, a location of a null may be referred to herein as corresponding to a vicinity of the signal harmonics. When so adjusted, the targeted signal harmonics are attenuated, and in some cases significantly attenuated, by the nulls. As such, the adjusted, adaptive nulling digital filter 130 essentially removes or 'nulls' out the targeted signal harmonics in producing the filtered digital signal $S'_d$. In some embodiments, the nulls are adapted to a received signal based on a priori knowledge regarding a characteristic of the signal (e.g., expected locations of the targeted signal harmonics and/or other undesirable signal components). In other embodiments, nulls are adapted using measured characteristics of the received signal instead of or in addition to using a priori knowledge of the signal characteristics. In some embodiments, adapting occurs dynamically during operation of test equipment employing the receiver channel 100. In other embodiments, the adapting is predetermined during manufacturing of the test equipment employing the receiver channel. The adaptive nulling digital filter 130 can be made or directed to adapt to and null out the targeted harmonics by using the control input. As such, the receiver channel 100 is capable of adaptive nulling of targeted (including undesired) harmonics and/or other undesired or interfering signal components.

In some embodiments, the adaptive nulling digital filter 130 is a finite impulse response (FIR) filter. A frequency response of the FIR filter 130 often is characterized by periodic nulls located on either side of a passband. The periodically located nulls may simplify an implementation and/or reduce a complexity of the FIR filter 130 when the periodic nulls are employed to attenuate similarly periodic signal harmonics.

Figure 2:
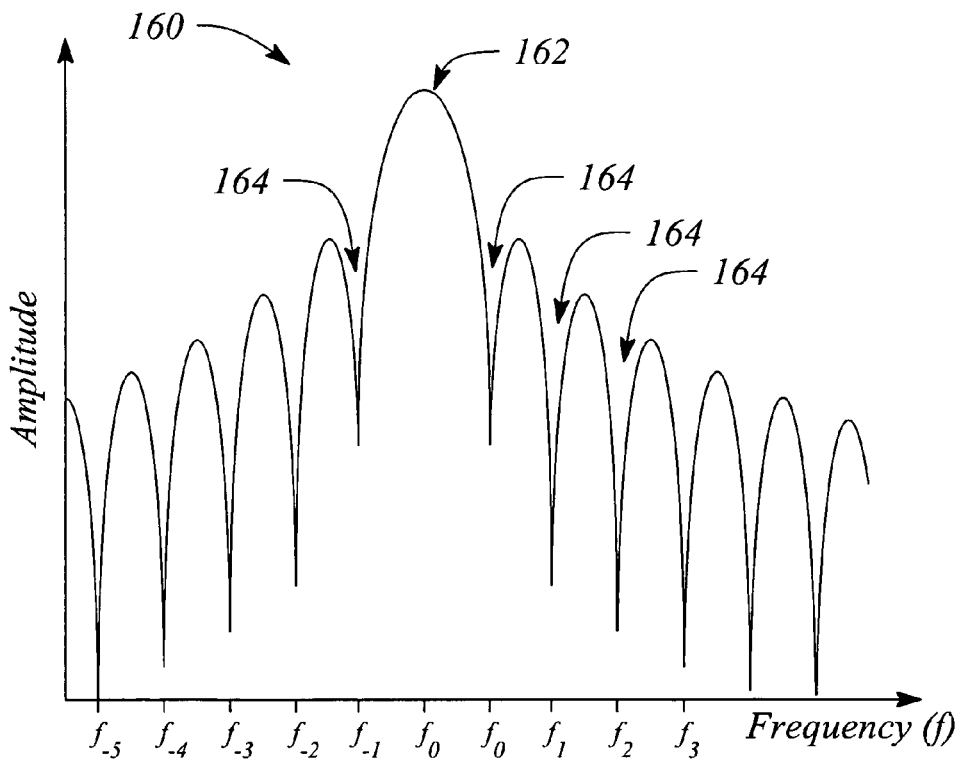
FIG. 2 illustrates a graph of a frequency response of an exemplary finite impulse response (FIR) filter according to an embodiment of the present invention.

FIG. 2 illustrates a graph of a frequency response 160 of an exemplary FIR filter 130 according to an embodiment of the invention. In particular, the frequency response 160 illustrated in FIG. 2 depicts a passband 162 of the exemplary FIR filter 130 located at a center frequency $f_0$ of the filter 130. FIG. 2 also illustrates a plurality of spaced apart nulls 164 located at frequencies $f_m$, where m=±1, 2, ..., on either side of the center frequency $f_0$ of the passband 162. In such embodiments, a frequency location $f_m$ of the periodic nulls 164 in the FIR filter 130 may be adjusted by changing a number of delay elements of the filter 130 and/or changing a weighting of a signal summation of the filter 130.

Figure 3:
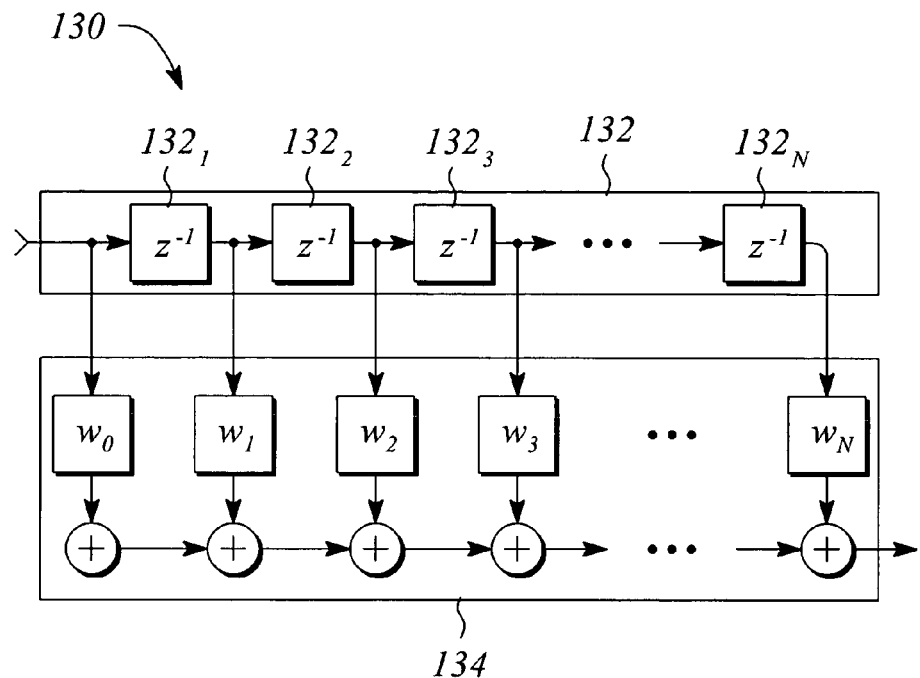
FIG. 3 illustrates an exemplary block diagram of an FIR filter according to an embodiment of the present invention.

FIG. 3 illustrates an exemplary block diagram of the FIR filter 130 according to an embodiment of the present invention. The FIR filter 130 comprises a tapped delay line 132 and a weighted summing element 134. The tapped delay line 132 comprises a plurality of delay elements $132_n$, where n equals 1 to N, arranged in series. Taps or sample points are located between each of the delay elements $132_n$, as well as preceding the first delay element $132_1$ and following a last delay element $132_N$. The taps sample the signal passing through the delay elements $132_n$ to produce sampled delayed signals.

The weighted summing element 134 receives the sampled delayed signals from the taps and applies a weighting value or weight $w_n$ to each of the delayed signals. The weighted summing element 134 sums together the weighted delayed signals to produce an output of the FIR filter 130. As such, the FIR filter 130 essentially produces a weighted summation of the delayed signals in the tapped delay line 132. In some embodiments, one or more of the weights may be zero. In some embodiments, one or more of the weights $w_n$ may be equal to one another. For example, an FIR filter 130 having a rectangular window response may comprises a plurality of delayed signals from consecutive taps weighted equally (e.g., $w_0=w_1=w_2=\ldots w_N=1$) prior to summing. A frequency response or transmission characteristic of the FIR filter 130 is controlled by the weights applied by the weighted summing element 134. A location of the nulls of the FIR filter 130 is controlled by one or both of the weights and the number N of the delay elements $132_n$ in the taped delay line 132, or equivalently, a number of sampled delayed signals included in the summation of the weighted summing element 134.

In other embodiments of the FIR filter 130 (not illustrated), additional summation elements as well as feedback and feed-forward paths within the filter 130 may be employed. The embodiments of the present invention are not limited to a particular FIR filter 130 realization or filter topology. Details of FIR filter design, realization, and implementation are well known in the art and may be found in many textbooks on the subject of digital filters and/or digital signal processing, including, John G. Proakis et al., *Digital Signal Processing*, $2^{nd}$ Edition, Macmillian Publishing Company, 1992, incorporated by reference in its entirety herein.

In some embodiments of the present invention, an FIR filter with a rectangular window response is used as the FIR filter 130. In other embodiments, an FIR filter having an approximately rectangular window response is used as the FIR filter 130. In yet other embodiments, an FIR filter having other than a rectangular or nearly rectangular window response is employed as the FIR Filter 130.

In practice, the digital filter 130 may be realized in a variety of ways, depending on a particular implementation and application of the adaptive nulling receiver channel 100. For example, the digital filter 130 may be realized as a circuit, or a portion of a discrete or integrated digital circuit, such as, but not limited to, a circuit of a field programmable gate array (FPGA) or a circuit in an application specific integrated circuit (ASIC). Alternatively, the digital filter 130 may be a function or operation provided by a signal processor circuit or system or a function/subroutine of a computer program executed by a general purpose processor, such as a microprocessor.

Referring back to FIG. 1, in some embodiments, a filter (not illustrated) providing the adaptive nulling for the adaptive nulling receiver channel 100 may be an analog filter connected preceding (at an input of, or in front of) the frequency converter 110 (i.e., an RF adaptive nulling filter). In yet other embodiments, a filter (not illustrated) providing the adaptive nulling for the adaptive nulling receiver channel 100 may be an analog filter connected between the frequency converter 110 and the ADC 120 (i.e., an IF adaptive nulling filter). In such embodiments, the digital filter 130 may be omitted or may not provide adaptive nulling.

A specific form of the control input generally depends on a selected realization of the filter 130. For example, when the digital filter 130 is realized as a circuit or component of the receiver 100, the control input may be a physical input (e.g., parallel or serial input) of the circuit or component. In such an exemplary implementation, the control input may control values of the weights $w_n$ to adapt the filter nulls 164. Weights $w_n$ set to '0' may be used to effectively reduce a number of delay elements $132_n$, for example. In another circuit-base implementation, bypass switches (not illustrated) may be controlled by the control input such that one or more delay elements $132_n$, are selectively bypassed (e.g., removed from the signal path) to change a number N of delay elements $132_n$. On the other hand, when the digital filter 130 is implemented as a function of a signal processor circuit or a computer program, the control input becomes an input to the function (e.g., a 'virtual' control input). One skilled in the art, having selected an implementation of the filter 130, would be able to determine a form and an implementation of the control input without undue experimentation.

In some embodiments, the adaptive nulling receiver channel 100 further comprises an IF gating switch 140. The IF gating switch 140 gates or pulse modulates the IF signal $S_{IF}$. In particular, the IF gating switch 140 at times may pass the IF signal $S_{IF}$ while at other times, the IF gating switch 140 may block passage of the IF signal $S_{IF}$. In some embodiments, the IF gating switch 140 is an analog switch, such as but not limited to, a single pole, single throw (SPST) switch located between the converter 110 and the ADC 120. In other embodiments, the IF gating switch 140 is a digital switch that is located between the ADC 120 and the adaptive nulling digital filter 130. The IF gating switch 140 facilitates selecting portions of the IF signal $S_{IF}$ or alternatively, the digital signal $S_d$, depending on the embodiment. For example, using the IF gating switch 140, only portions within a pulse in the IF signal $S_{IF}$ may be selected and passed by the switch 140. IF gating using the IF gating switch 140 is discussed in more detail hereinbelow.

In some embodiments, an output of the receiver channel 100 at an output of the digital filter 130 is processed by a signal processor (not illustrated). The signal processor receives the filtered digital signal $S'_d$, optionally further refines and/or adjusts the signal, and compares the received signal with previously received signals and/or with signals received by other receiver channels. For example, the signal processor may be a general-purpose computer that executes a signal processing computer program stored in memory of the computer. In other embodiments, the signal processor may be a signal processor or a signal processing functionality of a VNA, for example.

To understand better the adaptive nulling receiver channel 100 of the present invention, consider an example of the receiver channel 100 used to measure S-parameters of a pulsed DUT. In particular, consider a pulsed signal applied to an input of the DUT and a pulsed output generated by the DUT, the pulsed output being received and processed by the receiver channel 100.

Figure 4:
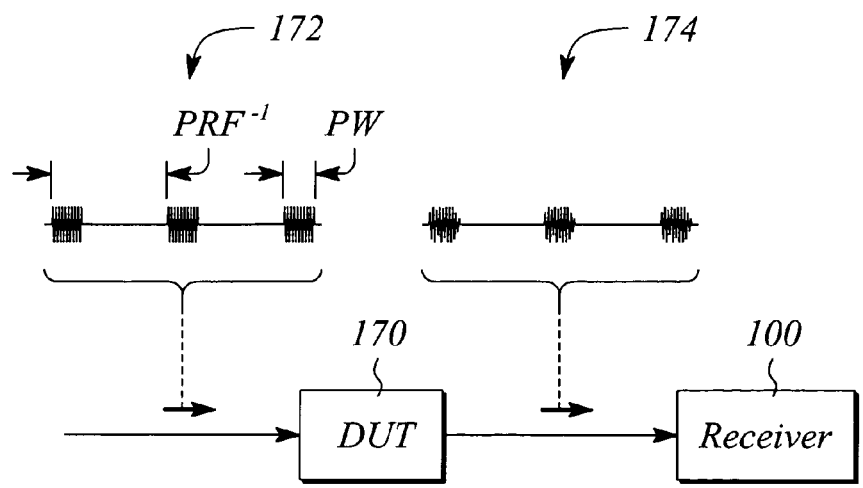
FIG. 4 illustrates diagrammatically a DUT having a pulsed input signal applied to an input of the DUT and a pulsed output signal generated at an output of the DUT, according to an embodiment of the present invention.

FIG. 4 illustrates diagrammatically a DUT 170 having a pulsed input signal 172 applied to an input of the DUT 170, the DUT 170 generating a pulsed output signal 174 at an output of the DUT 170, according to an embodiment of the present invention. The pulsed input and output signals 172, 174 are each characterized by a pulse repetition frequency (PRF) and a pulse width (PW). For the example, the PRF of the input signal 172 is assumed to be equal to the PRF of the output signal 174. FIG. 4 also illustrates the receiver channel 100 receiving the pulsed output signal 174.

Figure 5:
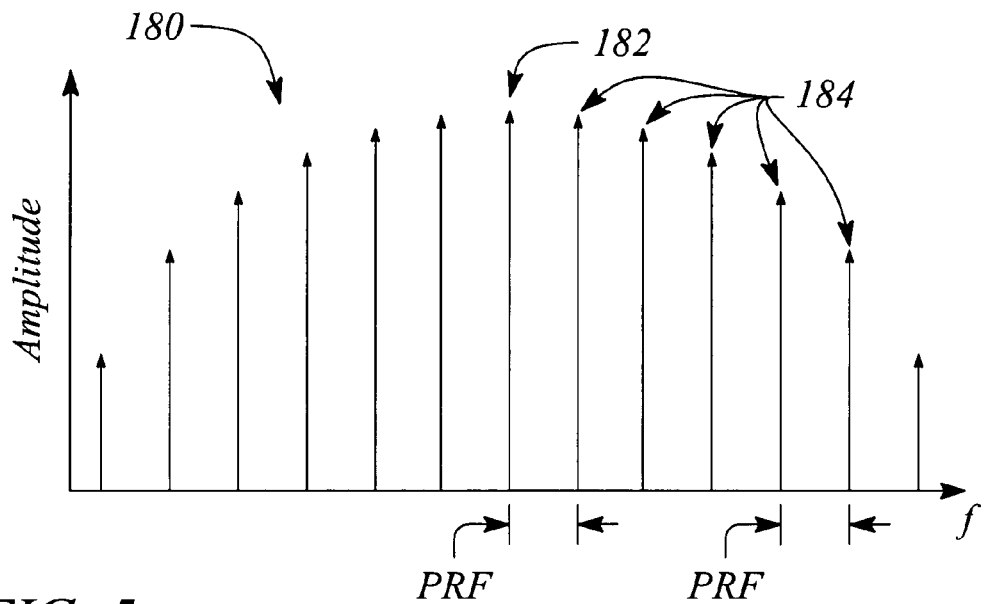
FIG. 5 illustrates a portion of a frequency spectrum of a pulsed signal according to an embodiment of the present invention.

FIG. 5 illustrates a portion of a frequency spectrum 180 of a pulsed signal (e.g., either the input signal 172 or the output signal 174) according to an embodiment of the present invention. In particular, as is characteristic of pulsed signals in general, the spectrum 180 has a fundamental frequency component 182 and a plurality of harmonic frequency components 184 or harmonics 184. The fundamental component 182 is centered at a frequency of the pulsed signal. Each harmonic frequency component 184 is spaced apart from either the fundamental component 182 or an adjacent harmonic frequency component 184, by a frequency equal to a PRF of the pulsed input signal. For example, the pulsed signal spectrum illustrated in FIG. 5 may represent the pulsed output signal 174 illustrated in FIG. 4, in which case the PRF spacing between components is given by the PRF of the pulsed output signal 174.

In general, only the fundamental component 182 is desirable when processing the pulsed signal 174 to obtain the DUT S-parameters using the VNA of the example. In particular, the presence of the harmonic components 184 degrades, or may even entirely prevent, a determination of S-parameters from the pulsed signal 174. As described hereinabove, prior to the present invention, a narrowband filter with a passband centered at the fundamental component 182 frequency and having a stopband beginning at about +/− the PRF from the passband center was used to remove the harmonics 184. Unfortunately, a minimum PRF that could be handled was established by a minimum achievable stopband width of the narrowband filter. The various embodiments of the present invention employ nulls in the frequency response of a filter (e.g., the digital filter 130) to remove the harmonics 184. In particular, the nulls are adapted to correspond to a given location or locations (or approximately correspond, such as to a vicinity or vicinities) of the harmonics 184 that are to be removed.

Figure 6:
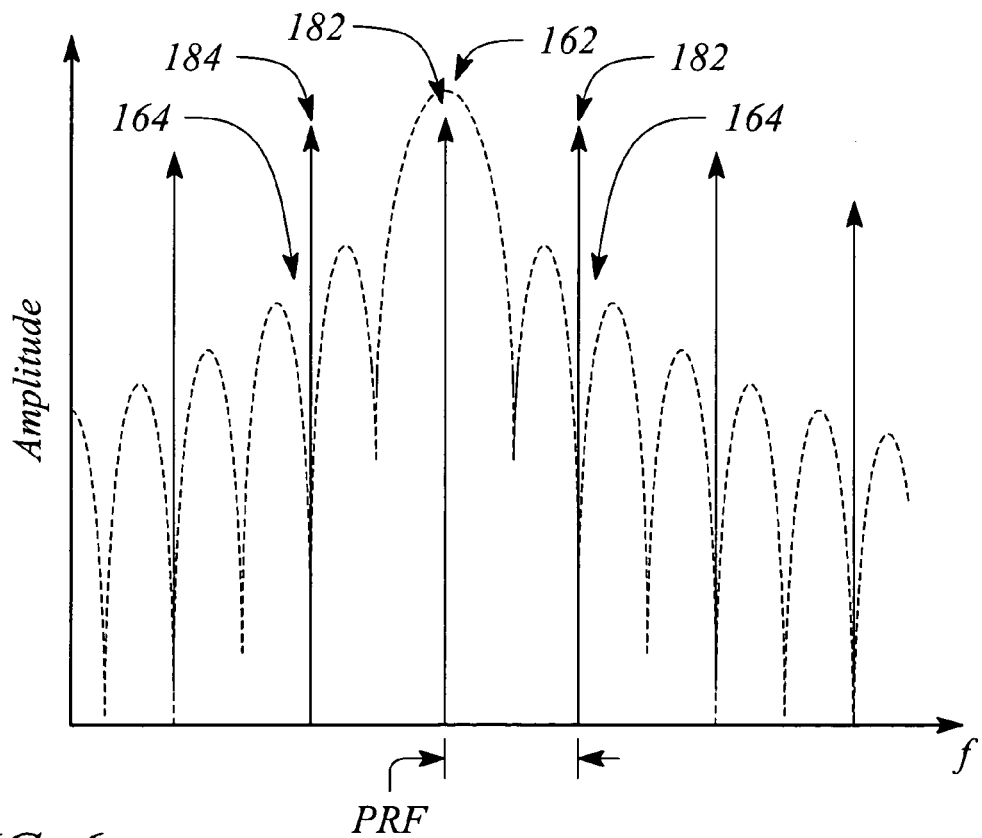
FIG. 6 illustrates a spectrum of the pulsed output signal illustrated in FIG. 4 overlaid on a frequency response of an adaptive nulling receiver channel according to an embodiment of the present invention.

FIG. 6 illustrates a spectrum of the pulsed output signal 174 illustrated in FIG. 4, overlaid on a frequency response of the adaptive nulling receiver channel 100. For discussion purposes, the frequency response of the adaptive nulling receiver channel 100 is assumed to correspond to or be approximated by the frequency response 160 of the adaptive nulling digital filter 130.

As illustrated in FIG. 6, nulls 164 of the digital filter 130 frequency response 160 are adjusted or adapted to correspond with or approximately equal frequency locations of the targeted harmonic frequency components 184. Similarly, the passband 162 of the digital filter 130 corresponds to a frequency of the fundamental component 182 of the pulsed signal 174. As such, the fundamental component 182 is passed by the filter 130 while the harmonic components 184 are attenuated or 'filtered out' by the adaptive nulling digital filter 130. In other words, by adjusting the nulls 164 of the digital filter 130 to correspond to approximate locations (i.e., vicinities) of the harmonics 184, the harmonics 184 are removed from the signal leaving only the fundamental component 182 of the pulsed signal 174.

While described hereinabove as removing harmonic frequency components 184 associated with a pulse spectrum of a pulsed signal 172, 174, the adaptive nulling digital filter 130 may also be employed to remove other frequency components. In particular, nulls 164 may be adjusted to remove other frequency components that may interfere with measurements being performed by the receiver channel 100. For example, harmonics generated by a signal source used to produce the pulsed input signal 172 may be removed by selectively adapting the nulls 164 of the digital filter 130. In another example, gate switch video feed-through may be similarly removed by adapting the nulls 164. In yet another example, a frequency component of an image of a first local oscillator may removed by adapting the nulls 164.

Referring again to FIG. 1 and the IF gating switch 140, the IF gating switch 140 provides an ability to sample, select, or 'gate' specific portions of a pulsed signal received by the receiver channel 100. In particular, the IF gating switch 140 provides an 'ON' state and an 'OFF' state in some embodiments. In the 'ON' state, the IF gating switch 140 allows passage of a signal. In the 'OFF' state, the IF gating switch 140 blocks the passage of the signal. As such, the IF gating switch 140 may be used to gate a specific portion or portions of the pulsed signal, the specific portion or portions being determined by a particular type of processing being performed using the receiver channel 100.

Examples of three types of gating are 'average pulse' gating, 'point-in-pulse' gating, and 'pulse profile' gating. In average pulse gating, the IF gating switch 140 is turned 'ON' approximately at a start of a pulse and turned 'OFF' approximately at an end of the pulse. Thus, a sample period of the average pulse gating is approximately equal to the pulse width of the pulse. Since average pulse gating essentially samples the entire pulse, the entire pulse is available for later processing upon leaving the receiver channel 100. For example, average pulse gating may be employed when determining an average power/energy in the pulse. In point-in-pulse gating, the IF gating switch 140 is turned 'ON' at some time following a leading edge of the pulse and turned 'OFF' some time before a trailing edge of the pulse. Thus, a sample period of the point-in-pulse gating is less than the pulse width of the pulse. Among other things, point-in-pulse gating facilitates minimizing transient effects in pulsed environment measurements of the DUT. In pulse profile gating, the IF gating switch is turned 'ON' and 'OFF' at a plurality of predetermined times following the start of the pulse. A time difference between 'ON' and 'OFF' may be very short (e.g., essentially instantaneous) compared to the pulse width. In essence, the pulse profile gating produces a sequence of samples of the pulse that follows a profile of the pulse. As such, using pulse profile gating, an amplitude profile of the pulse may be determined during later processing.

Figure 7A:
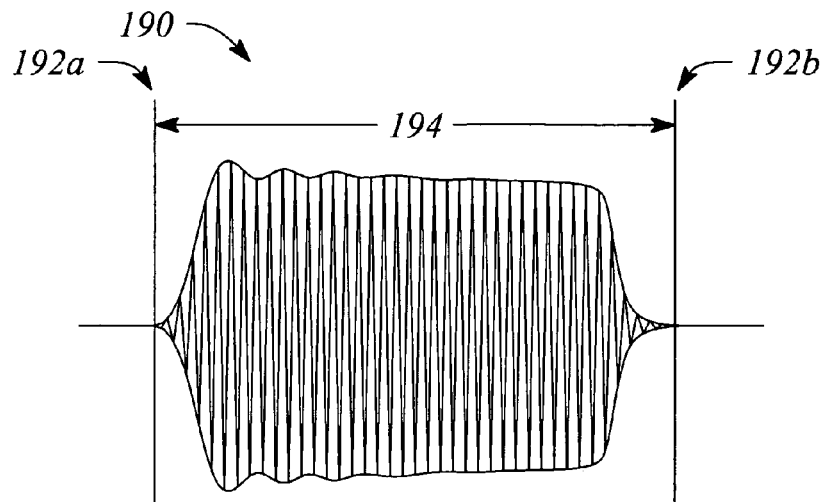
FIG. 7A illustrates an example of a pulse of a pulsed signal depicting average pulse gating provided by the IF gating switch according to an embodiment of the present invention.

FIG. 7A illustrates an example of a pulse 190 of a pulsed signal depicting average pulse gating provided by the IF gating switch 140 according to an embodiment of the present invention. A first vertical line 192a illustrated in FIG. 7A indicates a start of sampling when the IF gating switch is turned 'ON'. A second vertical line 192b illustrated in FIG. 7A indicates an end of sampling when the switch is turned 'OFF'. The sample period 194 is a time difference between the start and end of sampling, which is approximately equal to the pulse width of the pulse 190.

Figure 7B:
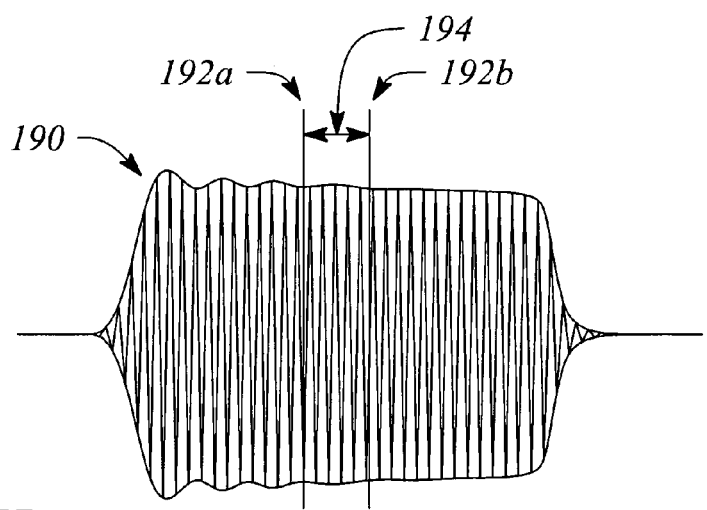
FIG. 7B illustrates an example of a pulse of a pulsed signal depicting point-in-pulse gating provided by the IF gating switch according to an embodiment of the present invention.

FIG. 7B illustrates an example of a pulse 190 of a pulsed signal depicting point-in-pulse gating provided by the IF gating switch 140 according to an embodiment of the present invention. A first vertical line 192a illustrated in FIG. 7B indicates a start of sampling when the IF gating switch is turned 'ON'. A second vertical line 192b illustrated in FIG. 7B indicates an end of sampling when the switch is turned 'OFF'. The sample period 194 is the time difference between the start and end of sampling which is shorter than the pulse width of the pulse 190.

Figure 7C:
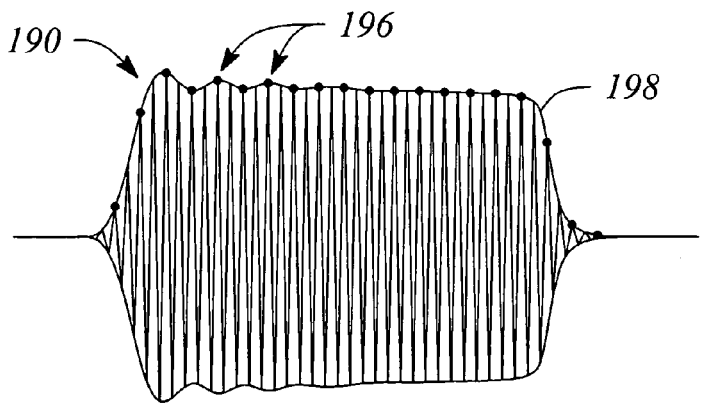
FIG. 7C illustrates an example of a pulse of a pulsed signal depicting pulse profile gating provided by the IF gating switch according to an embodiment of the present invention.

FIG. 7C illustrates an example of a pulse 190 of a pulsed signal depicting pulse profile gating provided by the IF gating switch 140 according to an embodiment of the present invention. In FIG. 7C, sample points 196 (i.e., 'ON/OFF' cycles of the IF gating switch 140) are illustrated as 'dots'. Note that the sample points 196 follow or trace out a profile 198 of the pulse 190.

Referring back to FIG. 1, in practice, the receiver channel 100 typically further comprises a filter (not illustrated for simplicity of discussion herein) that precedes the ADC 120. The filter, often referred to as an 'anti-aliasing' filter, is generally a lowpass filter that provides pre-filtering of the IF signal $S_{IF}$ prior to signal digitization by the ADC 120. In part, the pre-filtering provided by the anti-aliasing filter attenuates frequency components of the IF signal $S_{IF}$ above a Nyquist frequency reducing an introduction of aliasing-related distortions in the digital signal $S_d$ during digitization. The Nyquist frequency is one-half of a sample frequency $F_s$ of the ADC 120 (i.e., $f_{Nyquist}=F_s/2$). In addition, the pre-filtering by the lowpass filter may also reduce or limit an effect of additive noise and other interferences on the digital signal $S_d$. One skilled in the art is familiar with such anti-aliasing filters used in receiver channels having ADCs.

Also, while described in terms of adapting or adjusting the adaptive nulling filter 130 with a control input, one skilled in the art will readily recognize that the sample frequency $F_s$ of the ADC 120 is integrally related to null locations of the frequency response of the adaptive nulling filter 130. As such, synchronization between the sample frequency $F_s$ and the PRF of the input signal may be used to assist in nulling the targeted (for example, unwanted) frequency components in the pulsed signal. In particular, in some embodiments, null locations of the adaptive nulling filter 130 are adjusted or adapted by changing the sample frequency $F_s$ of the ADC 120 instead of or in addition to employing the control input of the filter 130 to adapt null locations. For example, given a particular PRF, a sample frequency $F_s$ may be selected that preferentially positions nulls of the filter 130 such that adaptive nulling is more readily realized by the filter 130. Therefore, adaptive nulling according to various embodiments of the present invention is intended to include within its scope the use of one or both of the sample frequency $F_s$ of the ADC 120 and the control input of the adaptive nulling filter 130, to adjust or adapt null locations.

Additional features and applications of the adaptive nulling receiver channel 100 according to the present invention, including the IF gating, are described in Robert Shoulders et al., "Pulsed Antenna Measurements with the Agilent PNA Microwave Network Analyzer", *Proceedings of the Meeting and Symposium of Antenna Measurement and Techniques Association*, Irvine, Calif., USA, 2003, pp. 86-91, in L. Betts et al., "Improved Techniques for High-Performance Pulsed Measurements using Microwave Vector Network Analyzers", *Proceedings of Asia Pacific Microwave Conference* (APMC) 2003, as well as in Loren Betts, "Make Accurate Pulsed S-Parameter Measurements", *Microwaves and RF*, November, 2003, Vol. 42, No. 11, all three of which are incorporated herein by reference in their entireties. Further background information regarding pulsed S-parameter measurements and pulsed network analyzers in general may be found in 5989-0563EN, "Agilent PNA Microwave Network Analyzers—Accurate Pulsed Measurements", Application Note 1408-11, Agilent Technologies Inc, Feb. 17, 2004, incorporated herein by reference.

Figure 8:
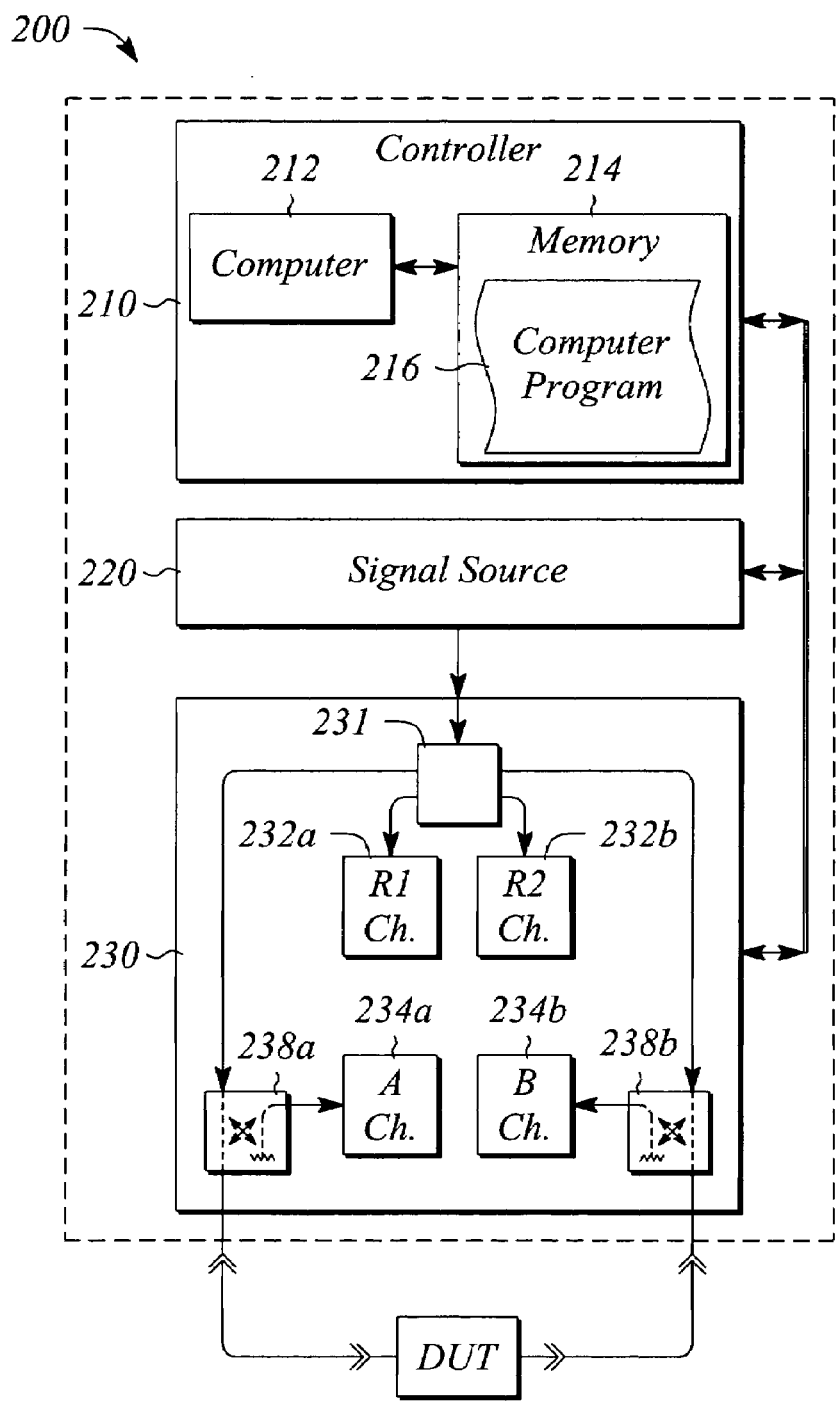
FIG. 8 illustrates a block diagram of a pulsed environment test system having adaptive nulling according to an embodiment of the present invention.

FIG. 8 illustrates a block diagram of a pulsed environment test system 200 having adaptive nulling according to an embodiment of the present invention. In particular, the test system 200 employs adaptive nulling to separate and remove effects of harmonic components of a pulsed signal from a fundamental component of the signal. Removing the harmonic component effects enables accurate, well-characterized measurements to be performed using only the fundamental component of the signal. In some embodiments, the signal is a pulsed signal received by the test system 200 from a device under test DUT.

The test system 200 is representative of, but not limited to, a pulsed network analyzer (PNA) system and a pulsed spectrum analyzer system. Hereinbelow, for purposes of discussion and not by way of limitation, the test system 200 will be described in terms of a PNA system 200. In addition, the DUT measurements are described in terms of S-parameter measurements. One skilled in the art may readily extend that described with respect to the PNA system 200 to other related test systems 200 without undue experimentation.

The test system 200 comprises a controller 210, a pulsed signal source 220, and a test set 230. The controller 210 controls an operation of the pulsed signal source 220 and the test set 230. The controller 210 may also display results of the test system 200 operation such as, but not limited to, pulsed S-parameters measured for a device under test (DUT). The pulsed signal source 220 generates a pulsed RF signal. The pulsed RF signal comprises one or more pulses. A pulse repetition frequency (PRF), a pulse width (PW) as well as a frequency and a power level of the pulsed RF signal are controlled by the controller 210.

The test set 230 comprises a source switch 231, a first reference receiver channel ('R1 receiver channel') 232a, a second reference receiver channel ('R2 receiver channel') 232b, a first measurement receiver channel ('A receiver channel') 234a, a second measurement receiver channel ('B receiver channel') 234b, a first test port 238a, and a second test port 238b. The source switch 231 directs pulsed RF signals from the signal source 220 selectively to either the first test port 238a and the R1 receiver channel 232a or the second test port 238b and the R2 receiver channel 232b. In some embodiments, a single reference receiver (not illustrated) functions as both the R1 and R2 receivers 232a, 232b. In such embodiments, the single reference receiver may be located before the source switch 231, such that the single reference receiver receives a sample of the pulsed RF signal regardless of a switching state of the source switch 231.

During S-parameter measurement, the DUT is connected to the test set 230 at test ports. According to the switching state of the source switch 231, the pulsed RF signal is applied either to a port of the DUT connected to the first test port 238a or to the second test port 238b. Pulsed RF signals reflecting from and/or passing through the DUT re-enter the test ports 238a, 238b and are separated from the applied pulsed RF signal. The separated pulsed RF signals are directed by the test ports 238a, 238b to respective ones of the A receiver channel 234a and the B receiver channel 234b. For example, when the source switch 231 directs the applied pulsed RF signal to the first test port 238a, a signal reflected by the DUT that re-enters the first test port 238a is separated from the applied pulsed RF signal and is directed to the A receiver channel 234a. The applied pulsed RF signal, having also passed through the DUT and entered the second test port 238b, is directed by the test port 238b to the B receiver channel 234b.

Each of the receiver channels 232a, 232b, 234a, 234b, is an adaptive nulling receiver channel according to the present invention. In particular, the receiver channels 232a, 232b, 234a, 234b, comprise an adaptive nulling filter that provides adaptive nulling of frequency components in signals received and processed by the channels 232a, 232b, 234a, 234b. In some embodiments, the adaptive nulling filter is a digital filter providing an adjustment of a location of one or more nulls in a frequency response of the digital filter by way of a control input of the digital filter. In some of these embodiments, the digital filter is a finite impulse response (FIR) filter, wherein nulls of a filter response of the FIR filter are adjusted by changing one or both of a number of delay elements in the FIR filter and weights in a summation of the FIR filter. In some embodiments, control of adapting the digital filter is provided by the controller 210. In some embodiments, the digital filter is essentially the digital filter 130 described above with respect to the receiver channel 100.

In some embodiments, the digital filter may be realized as a circuit, or a portion of a discrete or integrated digital circuit, such as, but not limited to, a circuit of a field programmable gate array (FPGA) or a circuit in an application specific integrated circuit (ASIC). In other embodiments, the digital filter may be a function or operation provided by a signal processor circuit or system or a function/subroutine of a computer program executed by a general purpose processor, such as a microprocessor. For example, the digital filter may be implemented as part of a signal processing subsystem of one or both of the test set 230 or the controller 210. In another example, the digital filter may be implemented as part of a computer program executed by the controller 210.

In some embodiments, the receiver channels 232a, 232b, 234a, 234b further comprise a gating switch that selects a portion of a pulse for further processing. For example, the gating switch may be employed to produce one or more of average pulse gating, point-in-pulse gating and pulse profile gating described hereinabove. In some embodiments, the receiver channels 232a, 232b, 234a, 234b, may further comprise a frequency converter that converts the received pulsed RF signal to a pulsed IF signal. In such embodiments, the pulsed IF signal may be converted to a digital signal for application to the digital filter using an analog-to-digital converter (ADC). In other embodiments, the ADC directly converts the pulsed RF signal into the digital signal. In some embodiments, one or more of the receiver channels 232a, 232b, 234a, 234b comprise the adaptive nulling receiver channel 100 described hereinabove. In some of these embodiments, a single common LO (not illustrated) may be shared by the receiver channels 232a, 232b, 234a, 234b instead of each receiver channel 232a, 232b, 234a, 234b having its own LO.

In some embodiments, the receiver channels 232a, 232b, 234a, 234b may further comprise one or both of an RF filter and an IF filter. In some of these embodiments, one or both of the RF filter and the IF filter may provide adaptive nulling instead of or in addition to the digital filter.

In some embodiments, the controller 210 comprises a computer/processor 212 and memory 214, and a computer program 216 stored in the memory 214 and executed by the computer 212. The computer program 216 comprises instructions that, when executed by the computer 212, control a pulse repetition frequency (PRF) of the signal source 220 and control adaptive nulling in the receiver channels 232a, 232b, 234a, 234b of the test set 230. The computer program 216 further comprises instruction that control a location of nulls in a frequency response of the digital filter in the receiver channels 232a, 232b, 234a, 234b. In some embodiments, the computer program 216 comprises instructions that control the location of the nulls according to a controlled PRF of the signal source 220. In particular, a location of the nulls may be controlled to correspond to one or more harmonic components of the pulsed RF signal located at multiples of the PRF from a center or fundamental frequency component of the pulsed RF signal.

The computer program 216 may further comprise instructions that determine from measurements or other information a location of targeted frequency components in the pulsed RF signal and adjust nulls of the digital filter to correspond with the targeted frequency components. The targeted frequency components may include, but are not limited to, harmonic components of the pulsed RF signal, video feed-through of the gating switch, and an image frequency component of a local oscillator signal.

Figure 9:
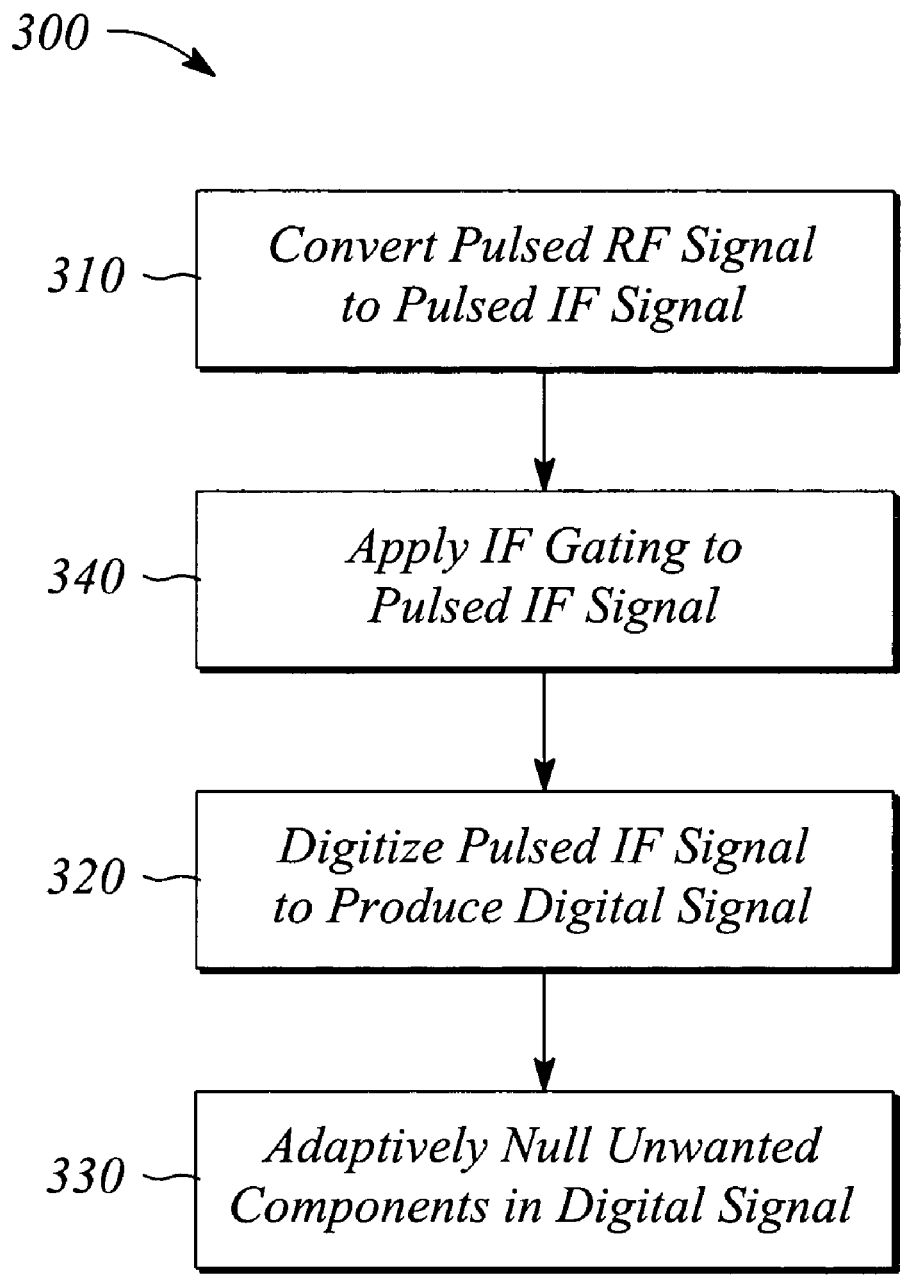
FIG. 9 illustrates a flow chart of a method of adaptive null filtering in a pulsed signal measurement environment according to an embodiment of the present invention.

FIG. 9 illustrates a flow chart of a method 300 of adaptive null filtering in a pulsed signal measurement environment according to an embodiment of the present invention. In some embodiments, the pulsed signal measurement environment comprises measuring S-parameters of a DUT using a pulsed RF signal as an input signal. In other embodiments, a power supply of the DUT or an operational characteristic of the DUT generates the pulsed RF signal being measured. Adaptive null filtering reduces an effect of harmonics in the pulsed RF signal on the DUT measurements according to the invention. In particular, nulls in a frequency response of the filtering are adapted or adjusted to vicinities of frequency locations of the harmonic components, thereby reducing or in some cases, essentially removing the harmonic components from the pulsed RF signal. The method 300 of adaptive null filtering is applicable to a variety of pulsed signal environment modalities and systems including, but not limited to, pulsed vector network analyzers used to measure pulsed S-parameters of a DUT and pulsed-measurement spectrum analyzers.

Referring to FIG. 9, the method 300 of adaptive null filtering comprises converting 310 a pulsed RF signal to a pulsed IF signal. The pulsed RF signal and the pulsed IF signal have a pulse repetition frequency (PRF) and a pulse width (PW). In some embodiments, the pulsed RF signal is converted by mixing the pulsed RF signal with a local oscillator signal. Mixing may be performed by a mixer that essentially multiplies the pulsed RF signal and the local oscillator signal, for example. The conversion may be either an upconversion wherein the pulsed IF signal has a frequency higher than that of the pulsed RF signal or a downconversion wherein the pulsed IF signal frequency is lower than that of the pulsed RF signal.

The method 300 of adaptive null filtering further comprises digitizing 320 the pulsed IF signal to produce a digital signal. Digitizing 320 is performed by an analog to digital converter in some embodiments. In some embodiments, converting 310 may be omitted and digitizing 320 is performed directly on the pulsed RF signal.

The method 300 of adaptive null filtering further comprises adaptively nulling 330 targeted frequency components in the digital signal. In some embodiments, the targeted frequency components are harmonics of the pulsed signal, the harmonics located at integer multiples of the signal PRF on either side of a fundamental frequency component of the signal. In some embodiments, adaptively nulling 330 comprises filtering the digital signal using a digital filter having adjustable nulls in a filter frequency response.

For example, nulls in a finite impulse response (FIR) filter may be adjusted by changing a number of delay elements in the filter, as was described hereinabove. In the example, nulls are adaptively positioned by selecting the number of delay elements such that the nulls approximately correspond to frequency locations of the targeted signal harmonics. Thus, adaptively nulling 330 is provided by the FIR filter through a selection of the number of delay elements.

In some embodiments, the method 300 further comprises applying IF gating 340 to the pulsed IF signal before digitizing 320. For example, time-gating 340 may comprise selectively opening and then closing a switch in the path of the pulsed IF signal. IF gating 340 allows only that portion of the pulsed IF signal corresponding to the opening of the switch to pass beyond the switch and be digitized 320. In essence, IF gating 340 samples the pulsed IF signal. Through IF gating 340, a variety of signal sampling modes may be implemented including, but not limited to, average pulse, point-in-pulse, and pulse profile, described hereinabove.

Thus, there has been described various embodiments of the present invention that facilitate measuring a DUT in a pulsed environment using one or both of adaptive nulling and IF gating. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. An adaptive nulling receiver channel comprising:
an adaptive nulling filter having a frequency response with one or more nulls that are adjustable, such that a null location is adjusted to correspond to a vicinity of a targeted frequency component in a pulsed signal, the filter adaptively filtering the targeted frequency component from the pulsed signal to produce a filtered pulsed signal.

2. The adaptive nulling receiver channel of claim 1, wherein the pulsed signal is a digital signal, the adaptive nulling filter being a digital filter that adaptively filters the targeted frequency component from the pulsed digital signal to produce a filtered pulsed digital signal.

3. The adaptive nulling receiver channel of claim 1, wherein the pulsed signal is a pulsed analog signal, the adaptive nulling filter being an analog filter that adaptively filters the targeted
frequency component from the pulsed analog signal to produce a filtered pulsed analog signal.

4. The adaptive nulling receiver channel of claim 1, further comprising:
an analog to digital converter (ADO) that samples and digitizes the pulsed signal to produce a pulsed digital signal, the adaptive nulling filter being a digital filter that filters the pulsed digital signal.

5. The adaptive nulling receiver channel of claim 1, wherein the pulsed signal is an RF input signal, the receiver channel further comprising a frequency converter that converts the pulsed RF input signal to an IF signal, the adaptive nulling filter filtering the pulsed IF signal.

6. The adaptive nulling receiver channel of claim 1, wherein the adjustable nulls of the adaptive nulling filter are adapted based on. one or more of a prior knowledge regarding a characteristic of the pulsed signal, measured characteristics of the pulsed signal, dynamics of the test system employing the receiver channel, a sample frequency F of an analog to digital converter (ADO), and a predetermined control input of the adaptive nulling filter.

7. The adaptive nulling receiver channel of claim 1, wherein the adaptive nulling filter is a finite impulse response (FIR) digital filter that comprises a tapped delay line and a weighted summation element, the FIR filter having a plurality of periodic nulls located on either side of a passband of the frequency response, a periodic null of the FIR filter being adjusted by changing one or both of a number of delay line elements and a summation element weight.

8. The adaptive nulling receiver channel of claim 1, further comprising:
an IF gating switch that provides gating of the pulsed signal, such that only a portion of the pulsed signal within a pulse is selected and passed by the switch to the adaptive nulling filter.

9. The adaptive nulling receiver channel of claim 8, wherein the gating provided by the IF gating switch comprises one or more of average pulse gating, point-in-pulse gating, and pulse profile gating to gate the pulsed signal.

10. The adaptive nulling receiver channel of claim 1, wherein the receiver channel is a component of a test system that uses the filtered pulsed signal to produce measured performance parameters of a device under test (DUT) wherein the test system is a pulsed network analyzer and the measured performance parameters are S-parameters.

11. The adaptive nulling receiver channel of claim 1, wherein both a location of the targeted frequency component and the adjustable null location are periodic in frequency.

12. A test system providing adaptive nulling, the test system comprising:
a pulsed signal source;
a test set comprising a plurality of receiver channels, a receiver channel comprising an adaptive nulling filter having adjustable nulls in a frequency response of the filter, such that a null location is adjusted to a vicinity of a targeted frequency component in a pulsed signal to adaptively filter the targeted frequency component from a fundamental frequency component of the pulsed signal; and
a controller that controls an operation of the pulsed signal source and the test set, wherein the test system measures performance parameters of a device under test (DUT) in a pulsed signal environment.

13. The test system of claim 12, wherein the controller controls an adjustment of the null location in the frequency response of the filter.

14. The test system of claim 12, wherein the test set further comprises a source switch, and a plurality of test ports, the source switch being independently connected to a set of reference receiver channels of the plurality and the test ports, the test ports being individually connected to a set of measurement receiver channels of the plurality, the test ports for further connecting to the DUT.

15. The test system of claim 12, wherein the receiver channel further comprises a gating switch that selects a portion of a pulse of the pulsed signal, the gating switch employing one or more of average pulse gating, point-in-pulse gating, and pulse profile gating in the portion selection.

16. The test system of claim 12, wherein the receiver channel further comprises one or more of a frequency converter that converts the pulsed signal from an RF signal to an IF signal, an analog to digital converter (ADC) that converts the pulsed signal from an analog signal to a digital signal, and a gating switch that selects a portion of the pulsed signal for adaptive null filtering.

17. The test system of claim 16, wherein the adaptive null filter of the receiver channel correspondingly is either an analog filter that adaptively filters one or more of the pulsed RF signal, the pulsed IF signal, and the pulsed analog signal or a digital filter that adaptively filters the pulsed digital signal.

18. The test system of claim 12, wherein the controller comprises:
a computer;
a memory; and
a computer program stored in the memory and executed by the computer, the computer program comprising instructions that, when executed by the computer, control a pulse repetition frequency (PRF) of the signal source, and adjust a null location of the adaptive nulling filter in the plurality of receiver channels.

19. The test system of claim 18, wherein the instructions of the computer program that adjust a null location control the null location according to the controlled PRF of the signal source, such that the null location corresponds to the targeted frequency component of the pulsed signal that is located at multiples of the PRY from the fundamental frequency component of the pulsed signal.

20. The test system of claim 18, wherein the instructions of the computer program further comprise determining a location of the targeted frequency component in the pulsed signal, and adjusting the null location of the filter to essentially correspond with the determined location, the targeted frequency component comprising one or more of a harmonic component of the pulsed signal, video feed-through of a gating switch in the receiver channel, and an image frequency component of a signal from a local oscillator in the receiver channel.

21. The test system of claim 12, wherein the adaptive nulling filter filters the targeted frequency components from the pulsed signal received from the DUT.

22. The test system of claim 12, where the test system is a pulsed network analyzer and the measured performance parameters are S-parameters of the DUT.

23. A method of adaptive null filtering comprising:
adaptively nulling targeted frequency components in a pulsed signal received from a device under test (DUT) to produce a filtered pulsed signal, wherein adaptively nulling comprises adjusting a location of a null in a frequency response of an adaptive nulling filter to correspond to a vicinity of a targeted frequency component, wherein the filtered pulsed signal facilitates measuring a performance of the DUT in a pulsed environment.

24. The method of adaptive null filtering of claim 23, further comprising:
digitizing the pulsed signal before adaptively nulling, wherein adaptively nulling comprises using a digital adaptive nulling filter having adjustable nulls in the frequency response of the digital filter.

25. The method of adaptive null filtering of claim 23, further comprising:
frequency converting the pulsed signal from an RF signal to an IF signal, wherein adaptively nulling comprises using an analog adaptive nulling filter having adjustable nulls in the frequency response of the analog filter.

26. The method of adaptive null filtering of claim 23, further comprising:
sampling the pulsed signal using a gating switch to select a portion of the pulsed signal to be sampled, wherein one or more of average pulse, point-in-pulse; and pulse profile sampling modes are used in sampling.

27. The method of adaptive null filtering of claim 23, further comprising:
converting the pulsed signal from an RF input signal to an IF signal;
digitizing the pulsed IF signal to produce a pulsed digital signal, wherein the adaptive nulling filter is a digital filter that produces a digital signal as the filtered pulsed signal.

28. The method of adaptive null filtering of claim 23, further comprising:
applying IF gating to the pulsed IF signal to allow only a portion of the pulsed IF signal to be digitized.

29. The method of adaptive null filtering of claim 23, wherein the measured performance is an S-parameter performance of the DUT.

30. The method of adaptive null filtering of claim 23, wherein the adaptive nulling filter is associated with a receiver channel of a vector network analyzer and both the null location of the filter and the targeted frequency component location are essentially periodic in frequency.

* * * * *

UNITED STATES PATENT AND TRADEMARK OFFICE
CERTIFICATE OF CORRECTION

PATENT NO. : 7,340,218 B2
APPLICATION NO. : 10/883100
DATED : March 4, 2008
INVENTOR(S) : Shoulders et al.

It is certified that error appears in the above-identified patent and that said Letters Patent is hereby corrected as shown below:

On the Title page, in field (56), under "Other Publications", in column 2, line 2, delete "Agilenet" and insert -- Agilent --, therefor.

In column 14, line 57, in Claim 4 , delete "(ADO)" and insert -- (ADC) --, therefor.

In column 15, line 1, in Claim 6, delete "on." and insert -- on --, therefor.

In column 15, line 1, in Claim 6, delete "prior" and insert -- priori --, therefor.

In column 15, line 4, in Claim 6, after "frequency" delete "F" and insert -- $F_s$ --, therefor.

In column 15, line 5, in Claim 6, delete "(ADO)," and insert -- (ADC), --, therefor.

Signed and Sealed this

Twenty-ninth Day of July, 2008

JON W. DUDAS
*Director of the United States Patent and Trademark Office*